United States Patent
Feichtinger et al.

(10) Patent No.: US 10,021,776 B2
(45) Date of Patent: Jul. 10, 2018

(54) COMPONENT CARRIER AND COMPONENT CARRIER ARRANGEMENT

(71) Applicant: EPCOS AG, Munich (DE)

(72) Inventors: Thomas Feichtinger, Graz (AT); Axel Pecina, St. Martin (AT)

(73) Assignee: EPCOS AG, München (DE)

( * ) Notice: Subject to any disclaimer, the term of this patent is extended or adjusted under 35 U.S.C. 154(b) by 0 days.

(21) Appl. No.: 14/654,369

(22) PCT Filed: Dec. 12, 2013

(86) PCT No.: PCT/EP2013/076426
§ 371 (c)(1),
(2) Date: Jun. 19, 2015

(87) PCT Pub. No.: WO2014/095587
PCT Pub. Date: Jun. 26, 2014

(65) Prior Publication Data
US 2015/0342027 A1    Nov. 26, 2015

(30) Foreign Application Priority Data
Dec. 21, 2012  (DE) ......... 10 2012 113 014

(51) Int. Cl.
*H05K 1/00*  (2006.01)
*H05K 1/02*  (2006.01)
(Continued)

(52) U.S. Cl.
CPC ......... *H05K 1/0204* (2013.01); *H01L 33/642* (2013.01); *H05K 1/0207* (2013.01);
(Continued)

(58) Field of Classification Search
CPC ... H05K 1/02; H05K 1/11; H05K 1/14; H05K 1/18; H05K 3/46; H05K 7/00; H05K 7/02; H05K 7/06; H01L 21/02; H01L 21/48; H01L 21/52; H01L 21/60; H01L 23/12; H01L 23/15; H01L 23/34; H01L 23/367; H01L 23/373; H01L 33/00; H01L 33/62
(Continued)

(56) References Cited

U.S. PATENT DOCUMENTS 4,922,377 A * 5/1990 Matsumoto ........... H01L 23/473
                                                    257/E21.511
4,943,470 A * 7/1990 Shiromizu ............ H01L 21/481
                                                    156/89.15
(Continued)

FOREIGN PATENT DOCUMENTS

CN   100479212 C   4/2009
CN   101800201 A   8/2010
(Continued)

*Primary Examiner* — Xiaoliang Chen
(74) *Attorney, Agent, or Firm* — Slater Matsil, LLP

(57) ABSTRACT

A component carrier includes a multi-layer carrier body having a substrate containing a structured functional. The substrate extends both laterally and also at least partially above and below the functional region. Alternatively, or in addition, the substrate extends both laterally and also completely above and/or below the functional region. Alternatively, or in addition, the substrate or a further region is arranged in or extends into the functional region.

10 Claims, 6 Drawing Sheets

(51) Int. Cl.
  *H05K 1/03* (2006.01)
  *H05K 3/00* (2006.01)
  *H01L 33/64* (2010.01)
(52) U.S. Cl.
  CPC ......... *H05K 1/0298* (2013.01); *H05K 1/0306* (2013.01); *H05K 3/0061* (2013.01); *H01L 2924/0002* (2013.01); *H05K 2201/066* (2013.01); *H05K 2201/10106* (2013.01); *H05K 2201/10416* (2013.01); *Y10T 156/10* (2015.01)
(58) Field of Classification Search
  USPC .... 174/252, 266; 361/52, 58, 709, 715, 717, 361/728, 735; 257/99, 246; 428/210; 438/675
  See application file for complete search history.

(56) References Cited

U.S. PATENT DOCUMENTS

| | | | |
|---|---|---|---|
| 5,285,352 A * | 2/1994 | Pastore | H01L 23/36 165/185 |
| 5,367,765 A * | 11/1994 | Kusaka | H01L 23/147 257/E21.511 |
| 5,731,067 A * | 3/1998 | Asai | H01L 23/3677 174/252 |
| 5,991,162 A * | 11/1999 | Saso | H05K 1/0207 257/700 |
| 6,544,365 B2 | 4/2003 | Tokuda et al. | |
| 6,730,183 B2 | 5/2004 | Tokuda et al. | |
| 7,728,234 B2 | 6/2010 | Wang | |
| 7,881,039 B2 | 2/2011 | Lee | |
| 8,008,682 B2 * | 8/2011 | Liaw | H01L 23/15 257/99 |
| 8,314,346 B2 * | 11/2012 | Hasegawa | H01L 33/642 174/252 |
| 9,425,137 B2 | 8/2016 | Naganuma et al. | |
| 2003/0016484 A1 | 1/2003 | Iwaida et al. | |
| 2003/0110629 A1 * | 6/2003 | Horng | H01L 21/4857 29/854 |
| 2003/0159783 A1 | 8/2003 | Kakimoto et al. | |
| 2004/0134875 A1 * | 7/2004 | Fukami | H01L 21/4857 216/13 |
| 2005/0186407 A1 | 8/2005 | Mori et al. | |
| 2006/0049421 A1 * | 3/2006 | Suehiro | C03C 8/08 257/99 |
| 2006/0170010 A1 * | 8/2006 | Brunner | H01C 7/1006 257/246 |
| 2006/0197062 A1 | 9/2006 | Nakamura | |
| 2006/0249758 A1 * | 11/2006 | Feichtinger | H01C 1/144 257/246 |
| 2006/0261364 A1 * | 11/2006 | Suehiro | H01L 33/56 257/100 |
| 2007/0159380 A1 | 7/2007 | Nagaishi et al. | |
| 2007/0200133 A1 | 8/2007 | Hashimoto et al. | |
| 2008/0029780 A1 * | 2/2008 | Ohtsuka | C03C 3/066 257/99 |
| 2008/0043444 A1 * | 2/2008 | Hasegawa | H01L 33/642 361/717 |
| 2008/0068845 A1 * | 3/2008 | Aida | B29D 11/00278 362/311.06 |
| 2009/0129027 A1 * | 5/2009 | Malik | H01L 23/64 361/715 |
| 2009/0230596 A1 | 9/2009 | Sawada et al. | |
| 2010/0065307 A1 * | 3/2010 | Nagase | H05K 1/021 174/252 |
| 2010/0181105 A1 * | 7/2010 | Hitomi | H01L 21/481 174/266 |
| 2010/0327068 A1 * | 12/2010 | Chen | G06K 19/07749 235/492 |
| 2011/0188161 A1 * | 8/2011 | Feichtinger | H01C 7/10 361/52 |
| 2011/0188210 A1 * | 8/2011 | Huang | H05K 1/14 361/735 |
| 2011/0261536 A1 * | 10/2011 | Feichtinger | H01C 1/084 361/713 |
| 2012/0286319 A1 | 11/2012 | Lee et al. | |
| 2013/0106530 A1 * | 5/2013 | Tajima | H03H 9/0571 333/133 |
| 2013/0337648 A1 * | 12/2013 | Lin | H01L 21/486 438/675 |
| 2014/0084182 A1 * | 3/2014 | Kim | H01L 33/62 250/492.1 |
| 2015/0243865 A1 * | 8/2015 | Feichtinger | H01L 33/642 257/88 |
| 2015/0334877 A1 * | 11/2015 | Kawagoe | H05K 7/20436 361/709 |
| 2015/0351258 A1 * | 12/2015 | Feichtinger | H05K 1/0204 428/201 |

FOREIGN PATENT DOCUMENTS

| | | |
|---|---|---|
| CN | 102779932 A | 11/2012 |
| DE | 102009010179 A1 | 9/2010 |
| EP | 0475223 A2 | 3/1992 |
| EP | 0926729 A2 | 6/1999 |
| EP | 2330639 A1 | 6/2011 |
| EP | 2381451 A1 | 10/2011 |
| EP | 2437581 A1 | 4/2012 |
| EP | 2523230 A2 | 11/2012 |
| JP | 50143073 A | 11/1975 |
| JP | 64049247 | 2/1989 |
| JP | H0758239 A | 3/1995 |
| JP | 08148839 | 6/1996 |
| JP | 08335782 | 12/1996 |
| JP | 2001244117 A | 9/2001 |
| JP | 2002353625 A | 12/2002 |
| JP | 2003017356 A | 1/2003 |
| JP | 2003101228 A | 4/2003 |
| JP | 2003197459 A | 7/2003 |
| JP | 2003209026 A | 7/2003 |
| JP | 2004079862 A | 3/2004 |
| JP | 2004152908 A | 5/2004 |
| JP | 2004179181 A | 6/2004 |
| JP | 2004253579 A | 9/2004 |
| JP | 2005101367 A | 4/2005 |
| JP | 2006156447 A | 6/2006 |
| JP | 2006339559 A | 12/2006 |
| JP | 2007116217 A | 5/2007 |
| JP | 2010129759 A | 6/2010 |
| JP | 2010171157 A | 8/2010 |
| JP | 2012204754 A | 10/2012 |
| JP | 2012204783 A | 10/2012 |
| JP | 2012244170 A | 12/2012 |
| JP | 2003051675 A | 2/2013 |
| JP | WO2011089795 A1 | 5/2013 |
| KR | 20100086442 A | 7/2010 |
| KR | 1020120127109 A | 11/2012 |
| TW | 200541415 A | 12/2005 |
| TW | 201234540 A | 8/2012 |
| WO | 2005106973 A1 | 11/2005 |
| WO | 2006106901 A1 | 10/2006 |
| WO | 2007052619 A1 | 5/2007 |
| WO | 2008002268 A1 | 1/2008 |
| WO | 2012067203 A1 | 5/2012 |

* cited by examiner

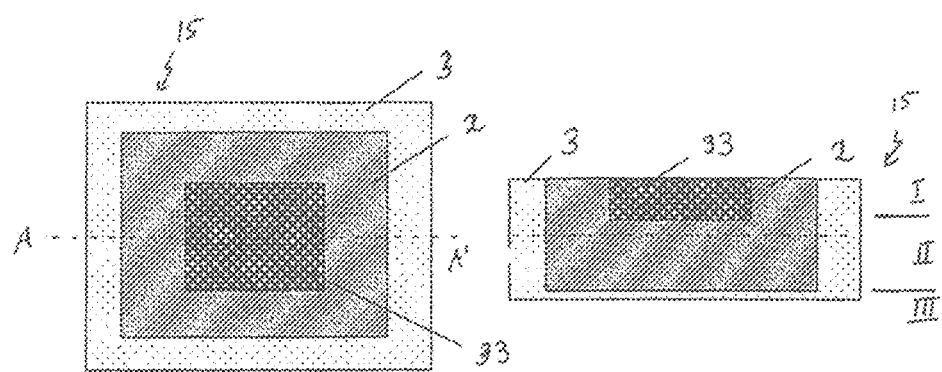

COMPONENT CARRIER AND COMPONENT CARRIER ARRANGEMENT

This patent application is a national phase filing under section 371 of PCT/EP2013/076426, filed Dec. 12, 2013, which claims the priority of German patent application 10 2012 113 014.0, filed Dec. 21, 2012, each of which is incorporated herein by reference in its entirety.

TECHNICAL FIELD

The invention relates to a component carrier having a multilayer carrier body having a substrate, to a component carrier arrangement, and to a method for producing such a multilayer carrier body.

BACKGROUND

In the design of carriers for high-power chips, so-called high-power chip carriers, such as are used, for example, for light emitting diode systems having high brightness, so-called high-brightness LED systems or HB LED systems, thermal management, luminous efficiency and lifetime are becoming more and more important. Efficient thermal management makes it possible to utilize the power reserves of the light emitting diodes, LEDs for short. In this case, the thermal performance of the LED carrier plays a crucial part in the overall system. High thermal conductivities of the carrier material that are greater than 100 W/mK are desired in HB LED applications. Further components for protecting the circuit arrangement can likewise be provided on the carrier.

One important requirement made of the carrier is, moreover, that the component acting as a heat source is positioned as near as possible to the heat sink element at the carrier underside, which requires a thin embodiment of the carrier of usually less than 500 μm. Moreover, an electrical insulation that is usually intended to fulfill a dielectric strength of 3000 V is desired between the heat source and the heat sink element.

Usually, the heat source or the component acting as a heat source is positioned at the top side of the carrier and the heat sink element is arranged at the underside of the carrier body, good heat dissipation from the heat source to the heat sink element being desired.

Hitherto, the LEDs and protective components, for example, a TVS element (transient voltage suppressor element or suppressor diode), have been constructed on a ceramic carrier comprising materials from the group AlOx, AN, for example, or a silicon carrier, the LED being placed onto the planar carrier surface. This is a so-called level 1 system comprising LED and a carrier and also a protective component. If the level 1 system is mounted onto a further carrier, this is referred to as a level 2 system.

SUMMARY

Embodiments of the invention provide a component carrier and a component carrier arrangement that enable a good heat dissipation.

A component carrier of one embodiment comprises a multilayer carrier body having a substrate containing a structured functional region. The substrate extends both laterally and also at least partly above and below the functional region, and/or the substrate extends both laterally and also completely above and/or below the functional region, and/or the substrate or a further region is arranged in the functional region or in a manner projecting therein.

Besides the substrate, the carrier body also has a structured functional region, that is to say a spatially delimited functional region within the substrate, which performs a function, for example, heat or current conduction. It is thus possible to form an integrated heat sink by means of which the heat can be dissipated from the component. The functional region usually extends vertically over a plurality of layers.

The dissipation of heat from the heat source, which can be an LED, for example, to the housing can take place via thermal heat sinks running vertically and/or horizontally in the substrate in the form of a thermally optimized block, and the use of a ceramic having a high thermal conductivity.

This enables good heat dissipation in conjunction with a small thickness of the carrier body. The integration of ultrathin protective components, which are, for example, only 0.1 mm thick or thinner, is possible. Such protective components can protect against electrostatic discharges (for example, by means of MLV elements/multilayer varistors or by means of TVS elements) and overcurrents (for example, by means of PTC elements, PTC thermistors) or can be used as temperature sensors (NTC elements, NTC thermistors).

The multilayer carrier body has a stacked construction since it is constructed from a multiplicity of films which were stacked to form a stack and which were subsequently consolidated, for example, by sintering to form the carrier body. The films have substrate regions and structure regions. The three-dimensional structured functional region arises as a result of the structure regions of the films lying one on top of another. Perpendicular lateral surfaces of the functional region arise as a result of films which are stacked one on top of another and in which the contours, that is to say the edges, of the structure regions correspond. Curved lateral surfaces of the functional region arise as a result of films in which the contours deviate slightly from one another from layer to layer in such a way that, when stacked one on top of another, they produce the curved lateral course. Edges in the lateral surface can be obtained by virtue of the contour of a structure region deviating significantly from the underlying contour, such that the structure region projecting beyond the underlying contour forms the underside of a protruding structure region having an edge at the layer boundary. The edge thus runs parallel to a longitudinal or transverse direction or the plane spanned thereby.

Such a carrier body constructed in a stacked fashion, as described above and hereinafter, can be produced by printing films by applying a first paste in a first area and applying a second paste in a second area, stacking and laminating the films in order to achieve an intimate connection of the areas and the films. Laminating is accompanied by action of heat and optional action of pressure.

Printing the first and second areas within a film contour produces a film for a film stack. A film is a thin sheet shaped from the printed areas of the dried first and second pastes. It comprises the printed first and second areas, the thickness of which corresponds to the film thickness. A third area can be printed with a third paste. The multilayer carrier body is produced from intimately connected, stacked and dried films having areas printed with different pastes. After stacking, the stacked first areas produce the substrate, and the second areas form the structured functional region. The pastes comprise the material of the substrate and of the functional region, respectively.

Arbitrarily structured functional regions can be produced as a result. The functional region can be, for example, a region extending continuously through the substrate, which region can serve as a through contact or heat sink.

The functional region can be shaped in such a way that flat structures, in particular structured layers, project from a main body of the functional region parallel to the longitudinal and/or transverse axis into the substrate. The main body can have a cylindrical shape, for example, that is to say with parallel base and top surfaces and a lateral surface formed by parallel straight lines. The protruding structured layers can be arranged in different planes one above another or in a manner offset with respect to one another. They serve for improved mechanical matching and reduced material stresses.

The functional region or the further region can be a cavity or a hollow space. In this case, the films from which the carrier body stack is formed have a cutout. Such a hollow space or such a cavity can have an arbitrary structure.

The functional region comprises material that differs from that of the substrate. The functional region can be metallic or comprise metallic layers, for example, copper, which has a good thermal and current conductivity. In order to form an integrated heat sink in the substrate by means of the functional region, use is made of material which has an increased thermal conductivity in comparison with the substrate. The thermal conductivity of the material for the functional region is advantageously greater than 100 W/mK. The substrate is a ceramic comprising $Al_2O_3$, for example. The substrate can comprise $Al_2O_3$ and glasses or LTCC ceramics.

A heat sink element is advantageously mounted at the underside of the multilayer carrier body, by means of which heat sink element the heat conducted through the substrate is dissipated. An insulation layer can be provided on the top side and/or underside of the multilayer carrier body. An insulation layer can be provided between the functional region and the heat sink element in order to prevent possible electrical influences by the integrated heat sink.

Such multilayer carrier bodies described above can be provided in a component arrangement comprising a component carrier comprising a multilayer carrier body having a substrate with a structured functional region arranged therein, the functional region serving as an integrated heat sink, and a component arranged on the functional region. Such a component arrangement can comprise an insulation layer at the underside of the multilayer carrier body, on which a heat sink is arranged. The functional region can have a cubic or cylindrical basic shape and its cross-sectional area at the top side of the carrier body can correspond to or project beyond that of the component. This enables a good heat dissipation. Furthermore, the functional region can has structured layers which project parallel to a longitudinal and/or transverse axis into the substrate and the substrate extends above and/or below the structured layers.

BRIEF DESCRIPTION OF THE DRAWINGS

The invention is explained below on the basis of exemplary embodiments with reference to the drawing.

In the figures:

FIGS. 3 and 4 show sectional illustrations of a further exemplary embodiment;

DETAILED DESCRIPTION OF ILLUSTRATIVE EMBODIMENTS

Figure 1:
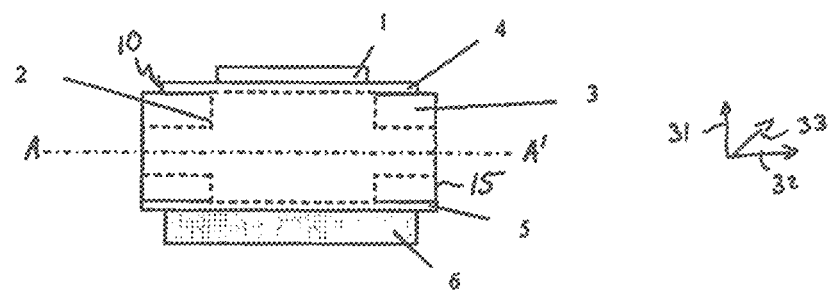
FIGS. 1 and 2 show sectional illustrations of one exemplary embodiment.
Figure 2:
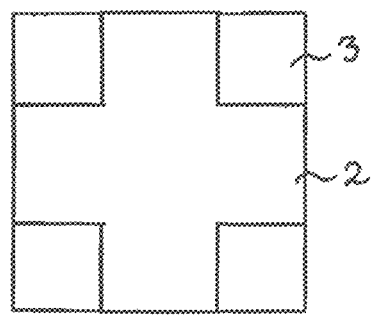

FIG. 1 shows one exemplary embodiment of a component carrier arrangement comprising a component carrier 10 comprising a component 1 arranged thereon, the component acting as a heat source. The illustration is a sectional view along the vertical axis 31 of the component carrier arrangement. FIG. 2 shows a sectional view along the line A-A' through this component carrier arrangement. The section runs in a plane parallel to the plane spanned by a longitudinal and transverse axis 32, 33. The axes are illustrated in the system of coordinate axes 31, 32, 33.

The component carrier 10 comprises a multilayer carrier body 15, which can serve as a carrier both for separate component parts or components 1 but also for conductor structures. The multilayer carrier body 15 is produced from stacked films and comprises a substrate 3 comprising a carrier material, for example, an $Al_2O_3$ ceramic. A structured functional region 2 is provided in the substrate 3. The functional region 2 is a region having a locally increased thermal conductivity which serves as an integrated heat sink for heat dissipation.

A conductor structure 4 is provided on the top side of the multilayer carrier body 15, by means of which conductor structure the contacting of the component 1 and/or a redistribution wiring can be implemented. Such a conductor structure 4 can comprise soldering pads for contacting the component 1, conductor tracks for voltage and current supply and also for signal transmission. The conductor tracks can run to terminals on the top side or to through contacts in the substrate 3. Such a conductor structure 4 can be metallic, for example, composed of copper.

A component 1 is fixed on the multilayer carrier body 15, the component emitting heat during operation. Such a component 1 can be an LED.

An electrical insulation layer 5 is applied at the underside of the multilayer carrier body 15, which electrical insulation layer can be formed from the same material as the substrate 3 or from a different material. The material and the layer thickness of the insulation layer 5 can be chosen such that a dielectric strength of 3000 V is achieved. In this exemplary embodiment, the insulation layer 5 extends over the entire underside of the carrier body 15. A heat sink element 6 is applied on the insulation layer 5. The heat sink element is an element by means of which the heat of the component 1 conducted through the substrate 3 is dissipated or emitted, for example, a cooling body or a housing part. However, a contact-connection is also conceivable.

In this exemplary embodiment, the functional region 2 runs from the top side of the multilayer carrier body 15 as far as the insulation layer 5. In the region adjacent to the component 1 and to the insulation layer 5, the structure 2 has a square cross section projecting slightly beyond the basic area of the component 1. In the region of the sectional plane A-A', the side regions of the structure 2 project as far as the edge of the multilayer carrier body 15, thus resulting in a cruciform cross section, as can be discerned in FIG. 2. The substrate 3 extends above and below the protruding structure regions.

The axially cruciform structure of the functional region 2 allows not only the dissipation of heat perpendicularly to the component 1, but also a dissipation of heat in a horizontal direction, which is effected by the cruciform cross-sectional widening.

FIG. 3 shows a plan view of one exemplary embodiment of a multilayer carrier body and a sectional view (on the right) through the latter along the line A-A'.

In this exemplary embodiment, a trough-shaped metallic structure or functional region 2 is surrounded by a ceramic substrate 3 at the side surfaces and at the base. A further, parallelepipedal structure 33, that is to say a further region, composed of a further material, for example, a different ceramic material, is provided in the structure 3.

This multilayer carrier body 15 is constructed from three different film types. In the upper region I, their area arrangement corresponds to the plan view. The rectangular third area 33 is surrounded by the frame-shaped second and first areas 2, 3. In the underlying region II, the films have a second area 1 without an inner contour. The second area 2 is rectangular. In the lower region III, the films are printed over the whole area with the paste for the first area 3.

The stacking of such identical films in each of the regions I, II, III with identical contours produces a multilayer carrier body 15 in which the lateral surfaces of the structures in these regions which result from the contours lying one above another run parallel to the vertical axis of the carrier body, that is to say perpendicularly to the film layers. Adjacent films in which different areas lie one on top of another form the horizontal interfaces between the trough-shaped structures.

In an alternative exemplary embodiment, a cavity can be provided instead of the further structure 33. The cavity is constructed from films having a cutout, that is to say an unprinted region, at a corresponding location.

Figure 5:
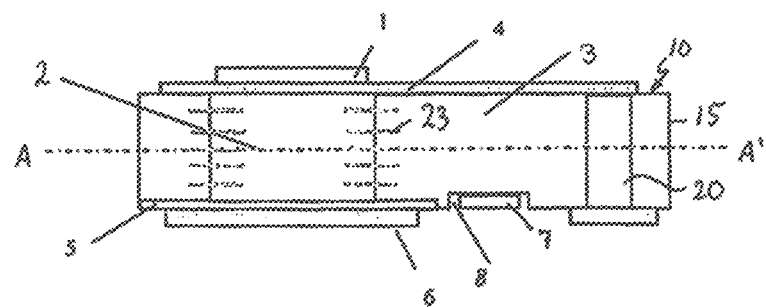
FIGS. 5 and 6 show sectional illustrations of a further exemplary embodiment.
Figure 6:
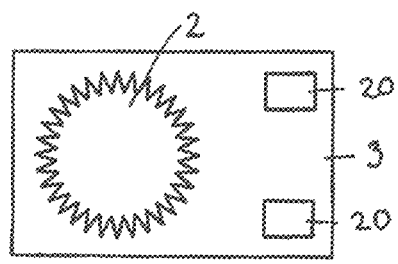

FIG. 5 shows a further exemplary embodiment of a component carrier arrangement comprising a component carrier 10 comprising a component 1 arranged thereon, the component acting as a heat source. The illustration is a sectional view along the vertical axis of the component carrier arrangement. FIG. 6 shows a sectional view along the line A-A' through the component carrier arrangement. The section runs in a plane parallel to the plane spanned by a longitudinal and transverse axis.

Essentially the differences with respect to the previous exemplary embodiments are described below.

The exemplary embodiment of a component carrier arrangement as shown in FIGS. 5 and 6 additionally comprises, besides the component 1—for example, an LED—arranged on the top side, a further discrete component 7, which is arranged in a cavity 8 in the underside of the carrier body 15.

This exemplary embodiment comprises three structured functional regions 2. A first functional region 2 extends below the component 1 arranged on the top side and runs from the top side of the carrier body 15 as far as the insulation layer 5. This functional region 2 serving as a heat sink has a cylindrical basic shape having a cross section whose round basic shape has a jagged edge, as is evident in FIG. 6. Horizontally running regions 23 embodied as structured layers project into the substrate 3 from the perpendicular lateral surface. These regions 23 running into the substrate can be a cross-sectional enlargement of the main body whose contour is at an identical distance from the contour of the lateral surface of the main body. Alternatively, they can be embodied in strip- or web-shaped fashion. Owing to their shape, they can also be designated as electrode structure. They improve the mechanical matching between metal and ceramic in the transition from the substrate to the functional region by virtue of the fact that, for example, material stresses are avoided.

Below the first functional region 2, an insulation layer 5 is provided between the first functional region and the heat sink. The insulation layer runs below the component 1, but in a manner projecting beyond the basic area thereof, but not in a large-area fashion over the entire underside of the multilayer carrier body 15.

The component carrier arrangement additionally comprises second and third functional regions 20, which run between the conductor structure 4 on the top side of the multilayer carrier body 15 and a heat sink element 6 on the underside. These functional regions are cylindrical with a rectangular cross section. They can serve as through contact or heat sink for a further component (not illustrated).

Figure 7:
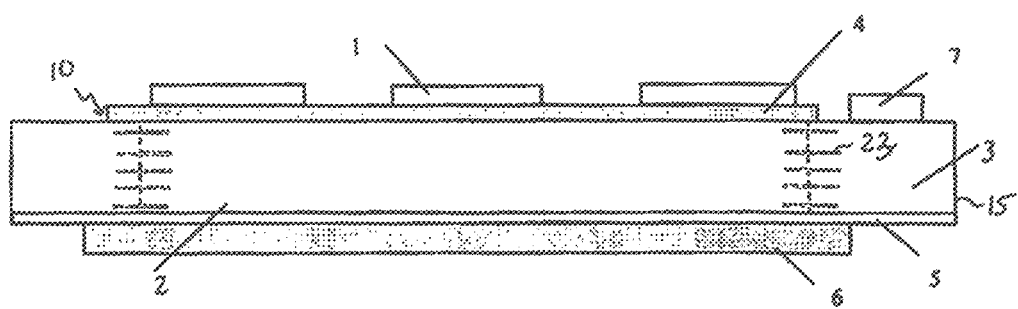
FIG. 7 shows a sectional illustration of a further exemplary embodiment.
Figure 9:
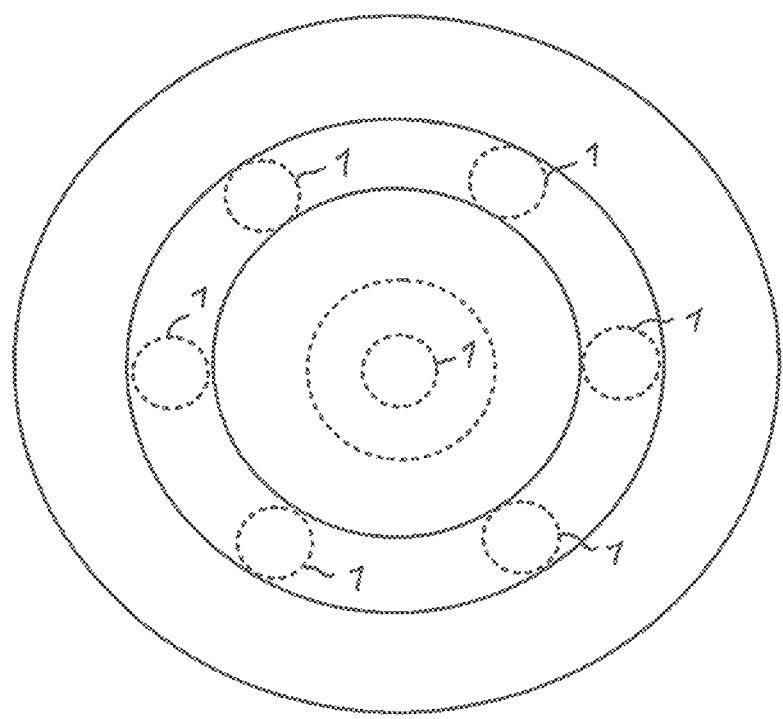

FIG. 7 shows a further exemplary embodiment of a component carrier arrangement comprising a component carrier 10 comprising a plurality of components 1 arranged thereon, which function as a heat source. The illustration is a sectional view along the vertical axis of the component carrier arrangement. The spatial arrangement of the LEDs can be as illustrated in FIG. 9.

Essentially the differences with respect to the previous exemplary embodiments are described below.

The component carrier arrangement comprises a plurality of components 1 arranged on the top side. The components can be LEDs which develop heat during operation. The structured functional region 2 extends below the region in which the components 1 are arranged, the structured functional region serving as a common heat sink for the components 1. The functional region 2 has a cylindrical main body extending from the top side of the multilayer carrier body 15 as far as the insulation layer 5. A common heat sink element 6 is provided on the insulation layer 5. Structured layers 23 extending horizontally into the substrate 3 are furthermore provided. The structured layers are arranged one above another in different planes. The substrate 3 extends above and below these regions.

Furthermore, beyond the functional region 2, a further, discrete component 7 is arranged on the top side of the carrier body 15, which component can be, for example, an integrated NTC temperature sensor or an MLV element as ESD protection (ESD is an abbreviation of "electrostatic discharge").

Figure 8:
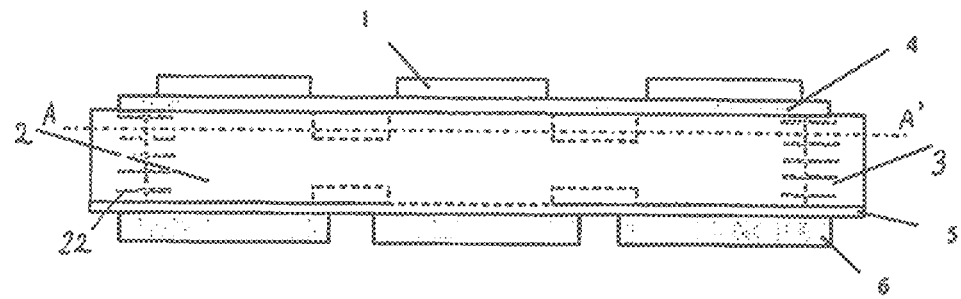
FIGS. 8 and 9 show sectional illustrations of a further exemplary embodiment.

FIG. 8 shows a further exemplary embodiment of a component carrier arrangement comprising a component carrier 10 comprising a component 1 arranged thereon, which function as a heat source. The illustration is a sectional view along the vertical axis of the component carrier arrangement. FIG. 9 shows a sectional view along the line A-A' through the component carrier arrangement. The section runs in a plane parallel to the plane spanned by a longitudinal and transverse axis.

Essentially the differences with respect to the previous exemplary embodiment are described below. This exemplary embodiment involves a component carrier arrangement comprising seven components 1, for example, LEDs. FIG. 9 shows the spatial arrangement of the components 1. One is arranged centrally, others are arranged in a ring-shaped manner around the component 1.

FIG. 8 differs from the previous exemplary embodiment essentially in the structure of the functional region 2. In this exemplary embodiment, too, an extensive functional region 2 is provided as a heat sink for the components 1. In the central region of the carrier body 15, the structured functional region 2 extends in a wide-ranging manner, but is led to the top side and underside only below the components and heat sinks. Consequently, there are substrate regions 3 not only at the edge of the multilayer carrier body 15 but also at the carrier body top side between the components 1. Furthermore, separate heat sink elements 6 are also provided below the components 1. In the lower region, too, the functional region has substrate regions between regions of the functional region which run to the heat sink elements 6. The regions of the functional region which run in the upper and lower regions of the multilayer carrier body can be island-shaped, such that their cross section substantially corresponds to the basic area of the components 1, or circular or ring-shaped, such that the components 1 are arranged on the circle or ring, as depicted schematically in FIG. 9.

In this exemplary embodiment, too, structured layers 23 project from the main body of the functional region into the substrate 3.

Figure 10:
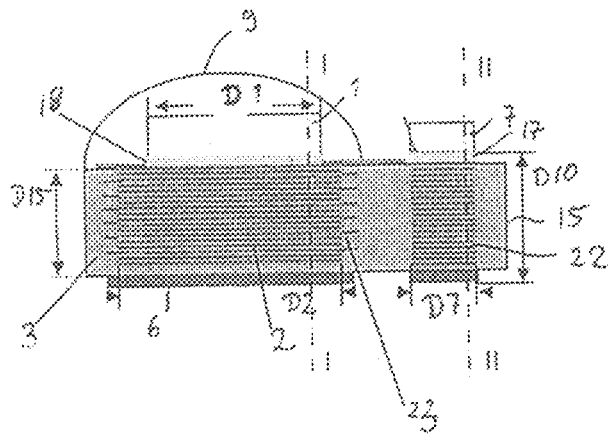
FIGS. 10, 11 and 12 show sectional illustrations of yet another exemplary embodiment.

FIG. 10 shows a sectional view through a further exemplary embodiment, similar to that shown in FIGS. 5 and 6.

In this exemplary embodiment, an LED as component 1 that develops a large amount of heat and also an MLV element as exemplary further component 7 are arranged on a multilayer carrier body 15. The component 1 is positioned below a lens 9.

The width D1 of such an LED can be 1000 µm, for example. It is fixed by solder, for example, comprising SnAgCu, on solder pads 18 on the carrier body 15. The width D7 of the further component 7 can be 300 µm. It is fixed on solder pads 17, for example, comprising Ag/Ni/Sn.

Heat sink elements 6 are arranged on the underside of the multilayer carrier body 15. Such a multilayer carrier body 15 can have a thickness D10 of 500 µm, wherein the substrate 3 has a thickness D15 of 400 µm.

There are arranged in the substrate 3 a first functional region 2, which serves as a thermal block or heat sink for the component 1, and also two further functional regions 22 as through contacts below the further component 7. The width D2 of the integrated heat sink is 1500 µm in both the longitudinal direction and the transverse direction. The distance from the edge of the carrier body is 700 µm (see FIG. 11). The width of the further functional regions corresponds to that of the further component 7. The width D2 of the main body of the integrated heat sink is 1500 µm in both the longitudinal direction and the transverse direction. The distance D3 from the edge of the carrier body is 700 µm (see FIG. 9). The width of the further functional regions corresponds to that of the further component 7 and is 300 µm.

The multilayer carrier body 15 has a stacked construction and comprises a multiplicity of films which were stacked and laminated in order to form the carrier body 15. The individual films comprise substrate areas whose configuration corresponds to the sectional view through the carrier body in the corresponding plane. Such films can be produced by printing with different pastes for the different areas, which are subsequently stacked and laminated. In this way, it is possible to produce arbitrary structures within the substrate 3. In this regard, for example, the regions 23 protruding from the main body of the functional region can be produced in a simple manner by means of the printed functional region of such a layer projecting beyond that of the underlying layer and of the overlying layer. In other words: structure regions of a film layer, or of a plurality of film layers, which project beyond the contours of the main body form the regions 23 projecting into the substrate 3.

Figure 11:
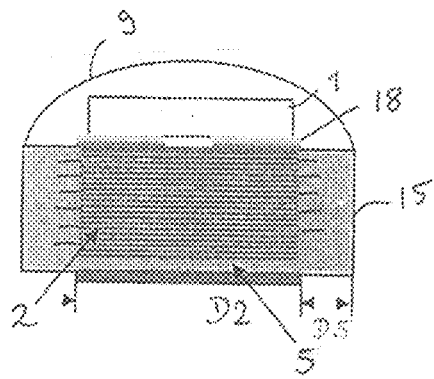
Figure 12:
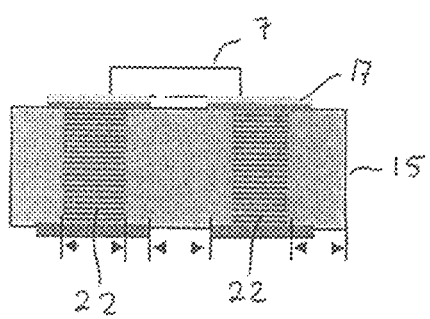

FIG. 11 and FIG. 12 show two further sectional views through the component along the lines I-I and II-II in FIG. 10. FIG. 11 shows the section I-I, in which it is clearly discernible that the LED is contacted by means of two contacts. In the section 2-2 it is discernible that the same also applies to the further component 7.

The features of the exemplary embodiments can be combined.

The invention claimed is:

1. A multilayer carrier body comprising:
 a first three dimensional structure having six side faces;
 a second three dimensional structure covering five of the six side faces and leaving one side face exposed; and
 a layer structure covering the second three dimensional structure except for the one side face of the first three dimensional structure and a side face of the second three dimensional structure adjacent to the one side face,
 wherein the second three dimensional structure comprises stacked films with a metallic material,
 wherein the layer structure comprises a first ceramic, and
 wherein the first three dimensional structure comprises a material different than the first ceramic and the metallic material.

2. The multilayer carrier body according to claim 1, wherein the second three dimensional structure has an increased thermal conductivity compared to the layer structure.

3. The multilayer carrier body according to claim 1, wherein the layer structure comprises $Al_2O_3$ or $Al_2O_3$ and glasses.

4. A component carrier comprising:
 a multilayer carrier body according to claim 1; and
 a heat sink element located at an underside of the multilayer carrier body.

5. The component carrier according to claim 4, further comprising an insulation layer located at a surface of the multilayer carrier body.

6. The multilayer carrier body according to claim 1, wherein the second three dimensional structure comprises metallic layers.

7. The multilayer carrier body to claim 1, wherein the material is a second ceramic.

8. The multilayer carrier body according to claim 1, wherein the first three dimensional structure has a parallelepiped structure.

9. The multilayer carrier body according to claim 1, wherein the first three dimensional structure is directly adjacent to the second three dimensional structure.

10. The multilayer carrier body according to claim 9, wherein the second three dimensional structure is directly adjacent to the layer structure.

\* \* \* \* \*